United States Patent
Ristau et al.

(10) Patent No.: US 6,805,750 B1
(45) Date of Patent: *Oct. 19, 2004

(54) SURFACE PREPARATION PROCESS FOR DEPOSITION OF CERAMIC COATING

(75) Inventors: Raymond P. Ristau, Tolland, CT (US); Sudhangshu Bose, Manchester, CT (US); Alan D. Cetel, West Hartford, CT (US)

(73) Assignee: United Technologies Corporation, Hartford, CT (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/274,127

(22) Filed: Mar. 23, 1999

Related U.S. Application Data

(60) Provisional application No. 60/089,152, filed on Jun. 12, 1998.

(51) Int. Cl.[7] .............................. B08B 3/04; B08B 3/10; B08B 3/12; B05D 3/12; C23G 5/00

(52) U.S. Cl. ....................... 134/1; 134/2; 134/6; 134/7; 134/19; 134/26; 134/40

(58) Field of Search ................................. 134/1, 2, 6, 7, 134/19, 26, 29, 30, 21, 40; 427/600, 601, 314, 318, 324, 377, 383.7, 399

(56) References Cited

U.S. PATENT DOCUMENTS

| | | | | |
|---|---|---|---|---|
| 4,321,310 A | * | 3/1982 | Ulion et al. | 428/612 |
| 4,321,311 A | * | 3/1982 | Strangman | 428/623 |
| 4,414,249 A | * | 11/1983 | Ulion et al. | 427/248.1 |
| 5,262,245 A | * | 11/1993 | Ulion et al. | 428/469 |
| 5,344,510 A | * | 9/1994 | Allen et al. | 148/675 |
| 5,643,474 A | * | 7/1997 | Sangeeta | 216/96 |

* cited by examiner

*Primary Examiner*—Zeinab El-Arini

(57) ABSTRACT

A method of surface cleaning and controlled oxidation of superalloys is described. The method provides a thin homogeneous layer of relatively pure alpha alumina which is suited to receive and adhere to a subsequent vapor deposited coating.

2 Claims, 1 Drawing Sheet

SURFACE PREPARATION PROCESS FOR DEPOSITION OF CERAMIC COATING

This application claims the benefit of U.S. Provisional Application Ser. No. 60/089,152, filed Jun. 12, 1998.

CROSS REFERENCE

This application is related to Application (EH-10151) filed on Jun. 12, 1998 entitled "Thermal Barrier Coating System Using Localized Bond Coat and Article Having the Same".

BACKGROUND OF THE INVENTION

The present invention provides the practical production ready process for cleaning superalloy components prior to the application of a ceramic thermal barrier coating. The ceramic thermal barrier coating towards which the invention process is directed is the type of coating described in the U.S. Pat. No. 5,262,245.

From a historical perspective, superalloys were originally used in the uncoated condition in gas turbine engines; in those early engines, the operating temperatures were sufficiently low that surface oxidation was not a problem. As operating temperatures increased and stronger alloys were developed (these stronger alloys tended to be more susceptible to oxidation and corrosion) various coatings were developed to protect the superalloy materials from oxidation and corrosion, and these types of coatings continue to be used in the present time. With yet further temperature increases, it became necessary to provide thermal barrier or insulation coatings on certain gas turbine components. Initially and these coatings were adhered to the existing metallic coatings. See for example U.S. Pat. No. 4,585,481 for a general description of oxidation protective coatings and see U.S. Pat. No. 4,321,311 and 5,514,482 for a background on the state-of-the-art electron beam physical vapor deposited (EBPVD) thermal barrier coatings (TBC).

The existing thermal barrier coatings with bond coats have been highly successful, but new engine designs which incorporate higher rotational speeds have resulted in a requirement to reduce the weight of the thermal barrier coating without sacrificing thermal insulations. In rotating blades, the mass of the coating provides a substantial pull on the blade root and by reducing the mass of the coating higher rotational speeds can be achieved thereby increasing engine efficiency and potentially allowing a reduction number of parts in the engine.

U.S. Pat. No. 5,262,245 describes a bond coat free thermal barrier coatings.

The problem with a bond coat free coating is to insure that the EBPVD ceramic coating adheres to the superalloy substrate.

FIELD OF THE INVENTION

This invention relates to the field of metal surface cleaning.

This invention also relates to the field of Electron Beam Physical Vapor Deposited Ceramic Coatings. More specifically this invention relates to a method for cleaning superalloy surfaces so that a subsequently deposited EBPVD ceramic coating will be durable and adherent.

BRIEF DESCRIPTION OF THE DRAWINGS

The FIGURE is a chart showing the oxidation characteristics of several elements at different temperatures and dew points.

DESCRIPTION OF RELATED ART

Figure 1:
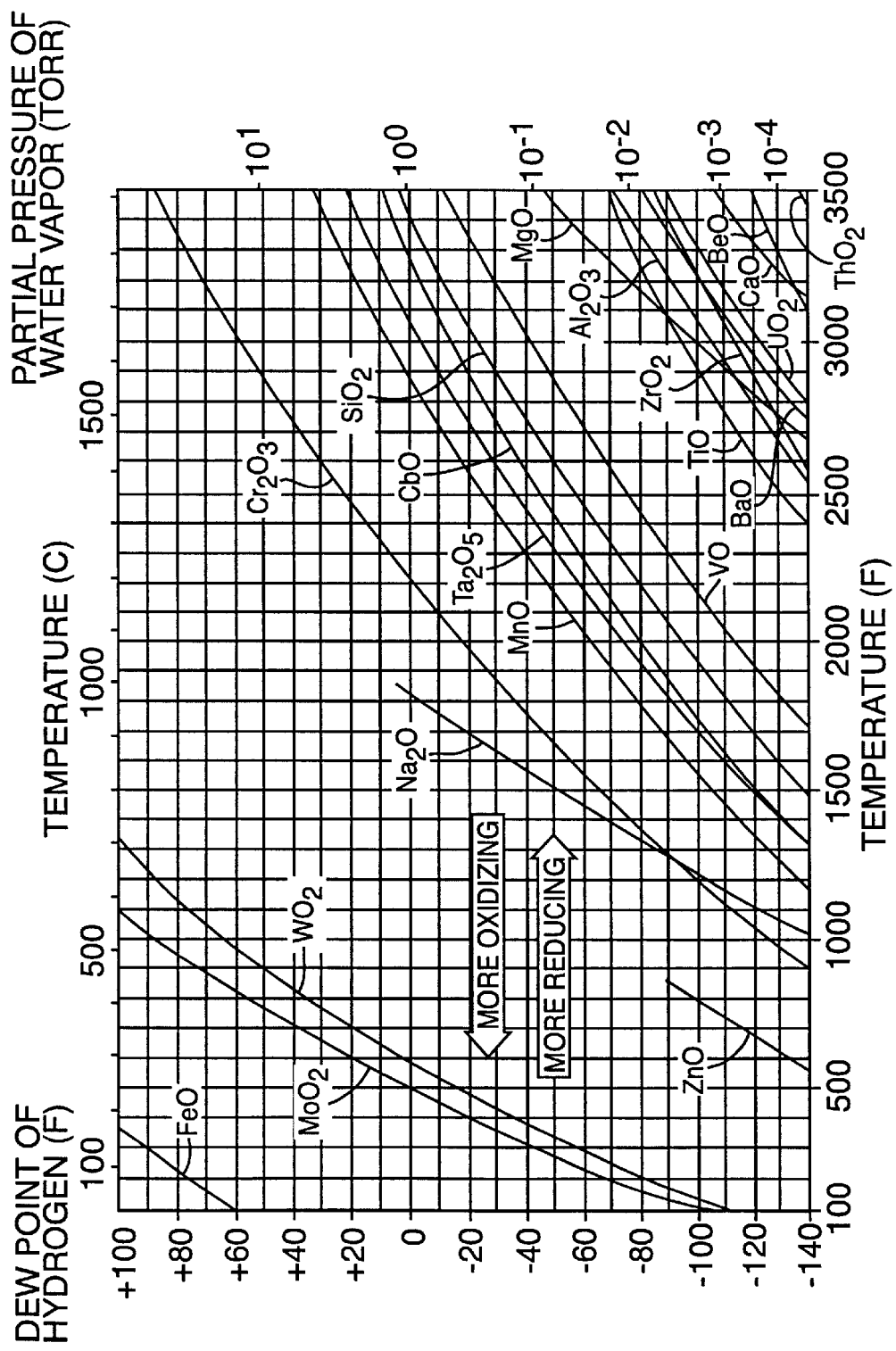

U.S. Pat. No. 4,321,310 shows a typical EBPVD ceramic thermal barrier coating in metallic substrate with a metallic overlay intermediate bond coat.

U.S. Pat. No. 5,514,482 shows a typical EBPVD ceramic thermal barrier coating on a metallic substrate with an aluminide intermediate bond coat.

U.S. Pat. No. 4,414,249 shows an EBPVD ceramic thermal barrier coating applied directly to a metallic surface without an intermediate bond coat.

U.S. Pat. No. 5,413,642 describes a method for controlled oxidation of an aluminum containing superalloy.

U.S. Pat. No. 5,538,796 shows a thermal barrier coating on a low sulfur superalloy substrate.

SUMMARY OF THE INVENTION

The invention comprises a method for cleaning a superalloy surface and then oxidizing that surface under conditions which promote the formation of alumina (preferably alpha alumina) rather than oxides of other elements contained in the superalloy.

The resultant high purity alumina scale is adapted to retain a subsequently deposited ceramic coating. Most preferably the subsequently deposited coating is deposited by electron beam physical vapor deposition, typically the ceramic will be zirconia based.

DETAILED DESCRIPTION OF THE PREFERRED EMBODIMENT

U.S. Pat. No. 5,262,245 provides a description of surface preparation process for bond coat free thermal barrier coatings. This process has been substantially refined and developed and is the subject of the present application.

The initial requirement is that the starting superalloy coating be of the proper composition to provide an adherent high purity alumina scale. Generally, more than about 5% Al by weight is required to form alumina upon oxidation. Cr which is also present in most superalloys enhances alumina formation.

Adherence of the alumina is enhanced by the presence of certain reactive elements including yttrium, hathnium, cerium and lanthanum, scandium and members of the Lanthanide and Actinide series. These elements are generally present in a total amount of from 0.01 to 0.5 percent by weight; we prefer the combination of yttrium and hafnium, but other combinations of elements are possible. Most specifically, we prefer to have about 0.013 weight percent yttrium and about 0.35 weight percent hafnium.

The superalloy preferably has a low sulfur content, and may be desulfurized according to the teachings of U.S. Pat. Nos. 5,346,563 and 5,344,510.

The superalloy material may be formed by casting. As is well known in the art various techniques exist to provide superalloy articles in the form of single crystal components, in the form of directional grain components and in the form of equiaxed grain components. The TBC coatings and the invention process have applicability to all forms of cast superalloy, generally single crystal superalloy articles are used in the high temperature environments where thermal barrier coatings are needed.

Starting with a superalloy component which will usually be a blade or a vane having the correct composition, the next major step is to provide a surface preparation process which will insure that the ceramic coating to be applied will be well adhered and durable.

The initial step is to remove from the surface of the component any residue of casting mold material or other foreign material which may be present. This is commonly achieved using a caustic solution which may be maintained at a high temperature and pressure in an autoclave apparatus. This preliminary step is usually performed at the casting vendor.

The parts received at the turbine component manufacturer typically have a surface which is free from casting molds residue but which may have other contaminants on the surface including grease, oil, dirt, and fingerprints. The finishing of the casting will typically involve one or more machining steps including grinding, hole drilling, surface finishing etc. which often leave residual contamination. The presence of any contamination on the surface to be coated is highly detrimental to the deposition of a quality coating.

The first step in the surface treatment performed by the component manufacturer, is to degrease the surface. Degreasing can be accomplished in a variety of ways. We prefer to heat the component in air at a temperature of about 1300° F. for a period of about one hour to vaporize and/or decompose any grease or oil which may be present on the part's surface. Other techniques known in the art may well be used including organic solvent degreasing using either the vapor or liquid form of the solvent, using solvents such as trichloroethylene or trichloroethane. In the case of thermal degreasing temperatures from about 1000 of up to 1500° F. for times from about fifteen minutes to ten hours may be suited for thermal degreasing with shorter times being generally associated with higher temperatures, and of course combinations of degreasing techniques may be utilized.

The next step of the process is a mechanical abrasion step which is used to remove surface oxide which may be present on the part as a consequence of the casting process and/or the thermal degreasing process (if thermal degreasing is used). Mechanical surface cleaning can be performed using a dry grit blasting process, or a wet grit blasting process which is also commonly called vapor honing. In the wet process, a jet of water containing abrasive media is directed at the surface part and the media removes a portion of the surface.

The mechanical surface cleaning process should be performed under conditions which do not remove more than about 0.1–5 mils and preferably 0.1–2 mils from the surface. While more material may be removed, removal of more than about 5 mils, preferably 2 mils is all that is required to provide a clean surface. Fine abrasive media is preferably used to provide a cleaned surface of high smoothness.

We favor the use of wet abrasive blasting using a quartz based abrasive material known as Novaculite 200 supplied by the Malvern Minerals Company of Hot Springs Ariz. We use a mixture of Novaculite abrasive in water (5 lbs per gallon) and project it against the part. The part constantly moves with respect to the vapor honing nozzle so that relatively uniform surface removal is obtained.

It should be noted that the typical component, for example an airfoil will receive the thermal barrier coating only on its airfoil and buttress or platform surfaces and not on its root surface. Consequently, cleaning of the root surface is not a priority and in fact the part is preferably held by the root during most of the cleaning process steps. Holding the part by the root or other portions which is not to be coated reduces the likelihood of contamination of the surface.

In addition, starting about this point in the cleaning process, we require that operators wear clean protective (nylon) gloves when they handle parts and/or that the parts be held in special racks which minimize damage or contamination of the surfaces to be coated.

Following the mechanical cleaning process, parts are ultrasonically cleaned in an aqueous solution containing a wetting agent (we use "Alconox", an anionic detergent which is a product of the Alconox Corp., 215 Park Avenue South, NY, N.Y. 10003). Ultrasonic cleaning removes any residue of the abrasive cleaning media which may be embedded in the surface and also removes any abrasive cleaning media which may have lodged in small holes or internal passages in the part. We manipulate the part in the ultrasonic bath so that all part surfaces which are likely to have retained any abrasive media are exposed in a downward sense so that the gravity will assist in removing the abrasive media. The total time for ultrasonic cleaning is in the range of two to five minutes. A mechanical robotic type of manipulator may advantageously be used if large numbers of parts are to be cleaned. In the case of components with intricate internal passages, ultrasonic cleaning may be preceded by a power water flush process.

Following the ultrasonic cleaning, the parts are again rinsed in pure water containing a small amount of the wetting agent (alconox) and the temperature of the rinse bath is preferably slightly elevated, about 90° F. to 150° F.

The parts are then rinsed in pure water (with no wetting agent) and are finally rinsed in water soluble organic solvent which leaves no residue on drying. We use ethyl alcohol denatured with isopropyl alcohol but believe that many other alcohols including methanol and isopropanol would be equally usable. The alcohol we use leaves a residue after evaporation of 0.001% or less. The alcohol acts as a wetting agent and helps to insure that the prior water and water solutions are completely removed from the part. In the case of hollow parts with cooling passages, clean high pressure air may then be used remove the bulk of the water and alcohol from the internal passages. The alcohol rinsed part is then air dried preferably using the heated airflow, for example a heat gun.

The part is then visually inspected for presence of regions of discoloration or evidence of water spots. If discoloration or water spots are observed the part is sent back to a prior process step, in the case of water spots the part may be sent back to the alcohol rinse step in the process other discolorations may require that the part be sent further back in the process perhaps as far back as the mechanical abrasion step.

The parts sent back within the process sequence then receive the remainder of the process steps until all parts and all surfaces to be coated meet the visual specifications.

Once the part passes visual specifications (no regions of discoloration and no water spots) the parts are ready for controlled oxidation. If the parts are to be held for any period of time (greater than about one hour or four hours) prior to oxidation, they are preferably stored in an appropriate storage container to prevent recontamination from airborne contaminants. We store parts in plastic bags which are useful for protection against surface contamination and also protection against surface damage which might occur when parts strike each other. It should also be observed that the invention process is preferably performed, and parts stored in a clean environment away from fumes, dust, vapors and other obvious sources of contamination.

Having provided a clean surface free from contamination and from essentially free from any surface oxide, the next major step is to develop the desired high purity alumina oxide of the necessary thickness to cause adherence and durable retention of ceramic thermal barrier coating which is to be applied.

The desired surface oxide which is termed a thermally grown oxide scale (TGO) is achieved by heat treatment in hydrogen gas having a particular dew point. We have found that hydrogen dew points from about −30° F. to about −50° F. are most advantageously used and are highly preferred. When the dew point is lower in temperature than about −50° the percentage of parts having a desirable oxide scale is reduced. When the dew point is higher than about −30° there is a tendency to form oxides (such as $Cr_2O_3$ and combinations of oxides (spinels)) other than alumina.

FIG. 1 shows the oxidation/reduction behavior of several metals, including many such as Mo, W, Cr, Ta, Cb, Ti and Al which are common constituents of superalloys. Conditions above and to the left of the line (higher dew points and lower temperatures) for a particular element cause oxidation of that element, conditions below and to the right (lower dew points and higher temperatures) cause reduction of the oxide of that element to the pure form of the metal.

The chart is not exact because the elements in a complex superalloy interact and affect the chemical activities of alloy elements, but it helps guide one skilled in the art to select conditions of dew point and temperature which will favor the formation of alumina rather than oxides of other elements such as Cr and mixed oxides or spinels. The conditions we prefer, 1900–2050° F. and a dew point of −30° F. to −50° F. can be seen to be located on the chart below the $Cr_2O_3$ line (thus these conditions do not favor the formation of $Cr_2O_3$) but above the $Al_2O_3$ line, thus favoring the formation of $Al_2O_3$ rather than $Cr_2O_3$.

We grow the surface alumina film by putting the parts in a retort using the appropriate fixturing so the parts not touch each other. The retort is flushed with argon and is then flushed with hydrogen gas of the previously described −30° to −50° dew point. This gas flushing serves to remove residual oxygen and the dew point of the hydrogen gas is monitored. The retort containing the parts is heated in a furnace but heating does not commence until the flushing process is complete and until the observed dew point of the gas flowing out of the retort is within the desired range. In an exemplary process argon is flowed through the retort at a rate which will achieve about three complete changes of gas within the retort per hour and the total flow time of the argon is continued until total change of atmosphere of about five times is accomplished.

For a retort volume of about 3 cubic feet the hydrogen is then flowed through the retort at a rate of about 30–40 cubic feet per hour after the argon flow has stopped and the hydrogen is flowed through the retort at this rate of 30 to 40 cubic feet per hour.

Hydrogen primarily serves a carrier gas for water vapor but may play some role in the oxidation step by virtue of its reducing properties. We believe that any inert gas, such as helium or argon, could be used as the carrier gas, provided that it contained the appropriate water vapor (about 100–350 ppm) to provide the desired −30° to −50° F. dew point. We believe that a mixture of hydrogen and argon and/or helium might be a useful carrier media, containing hydrogen but being non flammable.

We have observed the formation of the TiN (titanium nitride) phase when heat treating a superalloy containing 1.5 wt % Ti using commercially pure hydrogen, suggesting that the gas contained nitrogen as an impurity. We have not performed extension testing but we suggest that either low Ni gas be used, or that the carrier gas be flowed in contact with (heated) finely divided Ti or similar reactive metal if Ti containing alloys are being oxidized.

We prefer that the thickness of the TGO layer be from about 0.2 to about 2.0 microns in thickness, preferably 0.4–1.2 microns.

What is claimed is:

1. A method of preparing a superalloy substrate to receive a ceramic thermal barrier coating, without an intermediate bond coat, said superalloy being nickel base, containing 0.1–0.9% by weight of at least one element chosen from the group consisting of Y, $H_f$, Ce, La and mixtures thereof and containing sufficient Al to produce a predominately alumina surface film at elevated temperatures, said method including the steps of:
   a. degreasing said superalloy substrate;
   b. abrasively cleaning said superalloy substrate;
   c. ultrasonically cleaning said superalloy substrate;
   d. washing said substrate in an aqueous bath containing a wetting agent;
   e. rinsing said substrate at least once; and
   f. heat treating said substrate in an atmosphere that is non reactive with said substrate, non reactive with alumina, and which has a dew point of from about −30° F. to about −50° F. at a temperature and time sufficient to form a surface alumina layer which is predominately alumina and which has a thickness of from about 0.5 to 1.5 microns.

2. A method of preparing a superalloy substrate to receive a ceramic thermal barrier coating, without an intermediate bond coat, said superalloy being nickel base, containing 0.1–0.9% by weight of at least one element chosen from the group consisting of Y, $H_f$, Ce, La and mixtures thereof and containing sufficient Al to produce a predominately alumina surface film at elevated temperatures, said method including the steps of:
   a. degreasing said superalloy substrate;
   b. abrasively cleaning said superalloy substrate;
   c. ultrasonically cleaning said superalloy substrate;
   d. washing said substrate in an aqueous bath containing a wetting agent;
   e. rinsing said substrate at least once;
   f. rinsing said substrate in an aqueous organic solvent or aqueous solution of said solvent which dries without leaving a residue;
   g. drying said substrate; and
   h. heat treating said substrate in an atmosphere that is non reactive with said substrate, non reactive with alumina, and which has a dew point of from about −30° F. to about −50° F. at a temperature and time sufficient to form a surface alumina layer which is predominately alumina and which has a thickness of from about 0.5 to 1.5 microns.

* * * * *